(12) United States Patent
Yaul et al.

(10) Patent No.: US 12,687,581 B2
(45) Date of Patent: Jul. 21, 2026

(54) TECHNIQUE FOR ESTIMATION OF INTERNAL BATTERY TEMPERATURE

(71) Applicant: Analog Devices, Inc., Wilmington, MA (US)

(72) Inventors: Frank Yaul, Somerville, MA (US); Sunrita Poddar, Jamaica Plain, MA (US); Hemtej Gullapalli, Littleton, MA (US); Omer Tanovic, Cambridge, MA (US)

(73) Assignee: Analog Devices, Inc., Wilmington, MA (US)

( * ) Notice: Subject to any disclaimer, the term of this patent is extended or adjusted under 35 U.S.C. 154(b) by 885 days.

(21) Appl. No.: 17/698,472

(22) Filed: Mar. 18, 2022

(65) Prior Publication Data

US 2022/0206072 A1 Jun. 30, 2022

Related U.S. Application Data

(63) Continuation of application No. PCT/US2021/042505, filed on Jul. 21, 2021.
(Continued)

(51) Int. Cl.
*G01R 31/367* (2019.01)
*G01K 7/42* (2006.01)
(Continued)

(52) U.S. Cl.
CPC ........... *G01R 31/367* (2019.01); *G01K 7/427* (2013.01); *G01R 31/378* (2019.01);
(Continued)

(58) Field of Classification Search
None
See application file for complete search history.

(56) References Cited

U.S. PATENT DOCUMENTS

| | | |
|---|---|---|
| 6,294,897 B1 | 9/2001 | Champlin |
| 6,765,388 B1 | 7/2004 | Clegg |
| | (Continued) | |

FOREIGN PATENT DOCUMENTS

| | | |
|---|---|---|
| CN | 103427132 A | 12/2013 |
| CN | 105206888 | 12/2015 |
| | (Continued) | |

OTHER PUBLICATIONS

Zenati et al., *Estimation of SOC and the SOH of Li-Ion Batteries, By Combining Impedance Measurements with the Fuzzy Logic Inference*, 36th Annual Conference on IEEE Industrial Electronics Society, IEEE 2010, Feb. 8, 2010, XX pages.
(Continued)

*Primary Examiner* — Raymond L Nimox
(74) *Attorney, Agent, or Firm* — Schwegman Lundberg & Woessner, P.A.

(57) ABSTRACT

One embodiment is a method for estimating an internal temperature of a battery, the method comprising obtaining multiple terminal impedance measurements, wherein each of the terminal impedance measurements is taken at a different one of a plurality of frequencies; determining model parameters for a multivariable polynomial regression model; and applying the multivariable polynomial regression model to the multiple terminal impedance measurements to estimate the internal temperature of the battery.

20 Claims, 6 Drawing Sheets

Related U.S. Application Data

(60) Provisional application No. 63/174,646, filed on Apr. 14, 2021, provisional application No. 63/075,391, filed on Sep. 8, 2020.

(51) Int. Cl.

| | | |
|---|---|---|
| *G01R 31/378* | (2019.01) | |
| *G01R 31/382* | (2019.01) | |
| *G01R 31/389* | (2019.01) | |
| *G01R 31/392* | (2019.01) | |

(52) U.S. Cl.
 CPC ......... *G01R 31/382* (2019.01); *G01R 31/389* (2019.01); *G01R 31/392* (2019.01); *G01K 2217/00* (2013.01)

(56) References Cited

U.S. PATENT DOCUMENTS

| | | | |
|---|---|---|---|
| 9,164,150 | B2 | 10/2015 | Okada |
| 9,880,061 | B2 | 1/2018 | Wang et al. |
| 10,209,314 | B2 | 2/2019 | Garcia et al. |
| 10,310,020 | B2 | 6/2019 | Biletska et al. |
| 10,461,374 | B2 | 10/2019 | Srinivasan et al. |
| 10,601,085 | B2 | 3/2020 | Lim |
| 10,718,817 | B2 | 7/2020 | Oguma et al. |
| 2003/0184307 | A1 | 10/2003 | Kozlowski et al. |
| 2006/0284617 | A1 | 12/2006 | Kozlowski et al. |
| 2007/0093952 | A1 | 4/2007 | Wu et al. |
| 2007/0093958 | A1 | 4/2007 | Jonsson et al. |
| 2011/0060538 | A1 | 3/2011 | Fahimi et al. |
| 2013/0054603 | A1* | 2/2013 | Birdwell ............. G06F 16/2465 707/738 |
| 2013/0069660 | A1 | 3/2013 | Bernard et al. |
| 2013/0314049 | A1 | 11/2013 | Van Lammeren et al. |
| 2014/0372055 | A1* | 12/2014 | Wang ................... G01R 31/389 702/63 |
| 2015/0064510 | A1 | 3/2015 | Wang et al. |
| 2015/0147608 | A1 | 5/2015 | Lin et al. |
| 2015/0220100 | A1 | 8/2015 | Zhu et al. |
| 2015/0362559 | A1 | 12/2015 | Hametner et al. |
| 2016/0023567 | A1 | 1/2016 | Lee |
| 2016/0131719 | A1 | 5/2016 | Takahashi |
| 2016/0202324 | A1 | 7/2016 | Biletska et al. |
| 2016/0239592 | A1 | 8/2016 | Pourmousavi Kani |
| 2018/0217209 | A1 | 8/2018 | Marsili et al. |
| 2019/0036373 | A1 | 1/2019 | Shimura |
| 2019/0064278 | A1 | 2/2019 | Oguma et al. |
| 2019/0280493 | A1 | 9/2019 | Belkacem-Boussaid et al. |
| 2020/0326380 | A1 | 10/2020 | Wuebbeler et al. |
| 2021/0349157 | A1 | 11/2021 | Srinivasan et al. |
| 2022/0234449 | A1 | 7/2022 | Altaf |
| 2022/0334185 | A1 | 10/2022 | Tanovic et al. |
| 2022/0365139 | A1 | 11/2022 | Altaf |
| 2024/0012054 | A1 | 1/2024 | Yaul et al. |

FOREIGN PATENT DOCUMENTS

| | | | |
|---|---|---|---|
| CN | 105264709 | A | 1/2016 |
| CN | 105223487 | | 12/2017 |
| CN | 105223487 | B | 12/2017 |
| CN | 112602226 | A | 4/2021 |
| CN | 116075730 | A | 5/2023 |
| CN | 117355732 | A | 1/2024 |
| EP | 2762908 | | 8/2015 |
| EP | 2762908 | B1 | 2/2019 |
| EP | 3876334 | A1 | 9/2021 |
| GB | 2532726 | | 6/2016 |
| GB | 2532726 | A | 6/2016 |
| JP | 2015118022 | | 6/2015 |
| JP | 2015118022 | A | 6/2015 |
| JP | 2016065831 | | 4/2016 |
| JP | 2016065831 | A | 4/2016 |
| JP | 6245692 | | 12/2017 |
| JP | 2020054214 | | 4/2020 |
| JP | 2020054214 | A | 4/2020 |
| WO | WO-2019117955 | A1 | 6/2019 |
| WO | WO-2019215786 | A1 | 11/2019 |
| WO | WO-2020204584 | A1 | 10/2020 |
| WO | WO-2022055619 | A1 | 3/2022 |
| WO | WO-2022221090 | A1 | 10/2022 |

OTHER PUBLICATIONS

Liu et al., *Data-Driven Hybrid Internal Temperature Estimation Approach for Battery Thermal Management*, Hindawi Complexity, vol. 2018, Article ID 9642892, 17 pages.

Richardson et al., *Sensorless Battery Internal Temperature Estimation Using a Kalman Filter with Impedance Measurement*, 2015 IEEE, 10 pages.

Siyuan et al., *Battery Pack Temperature Field Compression Sensing Based on Deep Learning Algorithm*, 2019 14th IEEE International Conference on Electronic Measurement & Instruments (ICEMI), 2019, 7 pages.

JP2015118022A English Abstract, 1 page.

JP2020054214A English Abstract, 1 page.

JP2016065831A English Abstract, 1 page.

CN105223487B English Abstract, 1 page.

U.S. Appl. No. 18/044,550, filed Mar. 8, 2023, Technique for Estimation of Internal Battery Temperature.

U.S. Appl. No. 17/712,416, filed Apr. 4, 2022, Technique for Estimation of Internal Battery Temperature.

Liu, "Data-Driven Hybrid Internal Temperature Estimation Approach for Battery Thermal Management", Hindawi Complexity, vol. 2018, Article ID 9642892, (2018), 17 pgs.

Richardson, "Sensorless Battery Internal Temperature Estimation Using a Kalman Filter with Impedance Measurement", 2015 IEEE, arXiv: 1501.06160v1, (Jan. 25, 2015), 10 pgs.

Siyuan, "Battery Pack Temperature Field Compression Sensing Based on Deep Learning Algorithm", 14th IEEE International Conference on Electronic Measurement and Instruments (ICEMI), (2019), 7 pgs.

Ströbel, "Impedance Based Temperature Estimation of Lithium Ion Cells Using Artificial Neural Networks", MDPI Batteries, 7, 85, (2021), 15 pgs.

Wang, "Instantaneous Estimation of Internal Temperature in Lithium-Ion Battery by Impedance Measurement", Int. J. Energy Res., John Wiley and Sons Ltd., (2020), 16 pgs.

Zhu, "A New Lithium-Ion Battery Internal Temperature On-Line Estimate Method Based on Electrochemical Impedance Spectroscopy Measurement", Journal of Power Sources, vol. 274, (Jan. 2015), 990-1004.

"International Application Serial No. PCT/US2021/042505, International Preliminary Report on Patentability mailed Mar. 23, 2023", 7 pgs.

"International Application Serial No. PCT/US2021/042505, International Search Report mailed Oct. 21, 2021", 2 pgs.

"International Application Serial No. PCT/US2021/042505, Written Opinion mailed Oct. 21, 2021", 5 pgs.

"U.S. Appl. No. 17/712,416, Non Final Office Action mailed Feb. 25, 2025", 47 pgs.

"U.S. Appl. No. 17/712,416, Non Final Office Action mailed Jul. 25, 2024", 32 pgs.

"U.S. Appl. No. 17/712,416, Response filed Oct. 25, 2024 to Non Final Office Action mailed Jul. 25, 2024", 13 pgs.

"European Application Serial No. 21867314.3, Extended European Search Report mailed Oct. 17, 2024", 7 pgs.

"European Application Serial No. 22719441.2, Response to Communications Pursuant to Rules 161 and 162 EPC filed May 8, 2024", 12 pgs.

"International Application Serial No. PCT/US2022/023385, International Preliminary Report on Patentability mailed Oct. 26, 2023", 9 pgs.

"International Application Serial No. PCT/US2022/023385, International Search Report mailed Jul. 22, 2022", 4 pgs.

"International Application Serial No. PCT/US2022/023385, Written Opinion mailed Jul. 22, 2022", 7 pgs.

(56) References Cited

OTHER PUBLICATIONS

"U.S. Appl. No. 17/712,416, Final Office Action mailed Jul. 22, 2025", 46 pgs.

"U.S. Appl. No. 17/712,416, Response filed May 23, 2025 to Non Final Office Action mailed Feb. 25, 2025", 12 pgs.

"U.S. Appl. No. 18/044,550, Non Final Office Action mailed Aug. 8, 2025", 26 pgs.

"Chinese Application Serial No. 202180054980.1, Office Action mailed Jul. 24, 2025", W/English Translation, 28 pgs.

"European Application Serial No. 21867314.3, Response filed Apr. 29, 2025 to Extended European Search Report mailed Oct. 17, 2024", 12 pgs.

"Chinese Application Serial No. 202180054980.1, Request for Reexamination filed Apr. 21, 2026", W/English Claims, 13 pgs.

"Chinese Application Serial No. 202280036850.X, Office Action mailed Apr. 21, 2026", w/ English Translation, 21 pgs.

* cited by examiner

LITHIUM-ION BATTERIES
FOR TRAINING
204

200

AC IMPEDANCE/
TEMPERATURE
TRAINING DATA
202

LEAST SQUARES FIT

MODEL
PARAMETERS $c_{kp}$
206

210
DUT
(SAME MODEL)

REGRESSION:
$\hat{T}=f(Z,c_{kp})$
208

TEMPERATURE
ESTIMATE
212

402

MODEL PARAMETERS $c_{kp}$

404

PERTURBATION FOR BATTERY $i$: $c_{kpi} = c_{kp} + d_{kpi}$

406

SVD ON $d_{kpi}$

408

PERTURBATION BASIS VECTORS $u_n$

410

CALIBRATION DATA

414

FINAL MODEL PARAMETERS $c'_{kp}$

412 DUT

416

TEST DATA

418

REGRESSION: $\hat{T} = f(EIS, c'_{kp})$

420

TEMPERATURE ESTIMATE

400

TECHNIQUE FOR ESTIMATION OF INTERNAL BATTERY TEMPERATURE

CROSS-REFERENCE TO RELATED APPLICATION

This application claims the benefit of and priority to U.S. Patent Application Ser. No. 63/075,391 filed Sep. 8, 2020, entitled "TECHNIQUE FOR ESTIMATION OF INTERNAL BATTERY TEMPERATURE," U.S. Patent Application Ser. No. 63/174,646 filed Apr. 14, 2021, entitled "TECHNIQUE FOR ESTIMATION OF INTERNAL BATTERY TEMPERATURE," and International Patent Application Serial No. PCT/US2021/042505 filed Jul. 21, 2021, entitled, "TECHNIQUE FOR ESTIMATION OF INTERNAL BATTERY TEMPERATURE," each of which is incorporated herein by reference in its entirety.

FIELD OF THE DISCLOSURE

This disclosure relates generally to techniques for battery monitoring and, more particularly, to a technique for estimating internal temperature of a lithium ion battery using terminal impedance measurements.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION OF EXAMPLE EMBODIMENTS

Figure 1A:
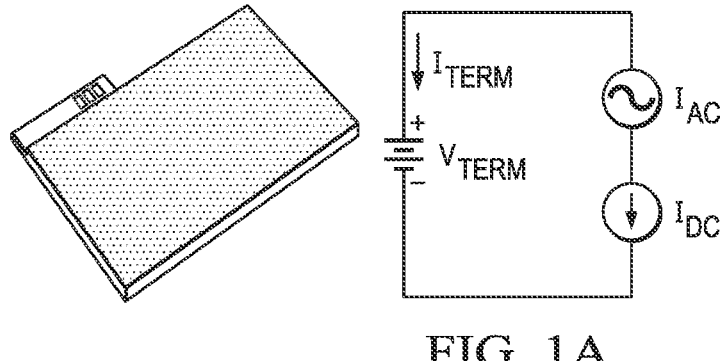
FIGS. 1A and 1B are simplified diagrams illustrating use of multivariable polynomial regression for estimating the internal temperature of a battery using terminal impedance measurements taken at multiple frequencies of an injected sinusoidal current in accordance with features of embodiments described herein.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. When used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The following disclosure describes various illustrative embodiments and examples for implementing the features and functionality of the present disclosure. While particular components, arrangements, and/or features are described below in connection with various example embodiments, these are merely examples used to simplify the present disclosure and are not intended to be limiting. It will of course be appreciated that in the development of any actual embodiment, numerous implementation-specific decisions must be made to achieve the developer's specific goals, including compliance with system, business, and/or legal constraints, which may vary from one implementation to another. Moreover, it will be appreciated that, while such a development effort might be complex and time-consuming; it would nevertheless be a routine undertaking for those of ordinary skill in the art having the benefit of this disclosure.

In the Specification, reference may be made to the spatial relationships between various components and to the spatial orientation of various aspects of components as depicted in the attached drawings. However, as will be recognized by those skilled in the art after a complete reading of the present disclosure, the devices, components, members, apparatuses, etc. described herein may be positioned in any desired orientation. Thus, the use of terms such as "above", "below", "upper", "lower", "top", "bottom", or other similar terms to describe a spatial relationship between various components or to describe the spatial orientation of aspects of such components, should be understood to describe a relative relationship between the components or a spatial orientation of aspects of such components, respectively, as the components described herein may be oriented in any desired direction. When used to describe a range of dimensions or other characteristics (e.g., time, pressure, temperature, length, width, etc.) of an element, operations, and/or conditions, the phrase "between X and Y" represents a range that includes X and Y.

Further, the present disclosure may repeat reference numerals and/or letters in the various examples. This repetition is for the purpose of simplicity and clarity and does not in itself dictate a relationship between the various embodiments and/or configurations discussed. Example embodiments that may be used to implement the features and functionality of this disclosure will now be described with more particular reference to the accompanying FIG-URES.

Lithium-ion batteries are rechargeable batteries that are commonly used for portable electronics and electric vehicles (EVs), as well as a variety of other applications, such military and aerospace applications. In order to monitor and maximize the performance of lithium-ion batteries, it is critical to monitor the internal temperature of such batteries during a variety of operations, such as fast charge and rapid discharge operations.

For larger batteries, such as EV batteries, the internal temperature of the battery has previously been monitored using thermal sensors, such as thermocouples, placed on the surface of the battery to monitor the surface temperature of the battery. This solution is non-ideal due to the delay in heat conductivity from the battery's internal core to the surface temperature, as well as the cost and complexity of implementing the necessary thermocouple network in connection with the battery.

For smaller batteries, such as those used in portable electronics such as cellular telephones, electrochemical impedance spectrometry (EIS) may be used to measure battery impedance and internal temperature is estimated using polynomial regression models based on an impedance measurement at a single empirically selected frequency. This solution is also non-ideal given that it does not compensate for battery state of health (SOH) or state of charge (SOC). Additionally, this method models impedance as a function of frequency and temperature averaged over SOC and has a high computational cost, given that it needs to solve an optimization problem at every step.

In accordance with features of embodiments described herein, the internal temperature of a rechargeable battery, such as a lithium ion battery, is estimated using terminal impedance measurements taken at multiple frequencies. The terminal impedance measurements are combined using multi-variable polynomial regression, which reduces the effects of state-of-charge (SOC) and state-of-health (SOH) variation on the temperature estimate, as compared to estimates based on a terminal impedance measurement taken at a single frequency.

In one embodiment, an internal temperature estimate is the weighted sum of polynomial functions of the phases of the impedance measured at each of several predetermined frequencies, which are selected to span a range over which there is sufficient temperature-, SOC-, and SOH-dependence variation to allow the weighted sum to work toward "canceling out" the impact of SOC and SOH variation on the final temperature estimate. In certain embodiments, the equation comprising the regression model is a linear function of its unknown parameters (e.g., the weights in the sum), so the model parameters may be fit at low computational cost using linear least squares. Embodiments described herein also have a relatively low computational cost, enabling the algorithm to be run on embedded processors. In certain embodiments, the regression equation may be augmented with additional terms, such as polynomial functions of cell capacity or terminal voltage, or cross-terms comprising the product of any aforementioned term. The unknown parameters of the regression equation may be calibrated based on prior measurements. For example, a database, or library, of pre-fit battery models can be created and the nearest-neighbor model for a battery can be selected based on a "factory calibration" impedance measurement taken when the battery is at specified conditions.

Embodiments described herein enable a lower-cost, less-intrusive battery temperature monitoring solution as compared with surface-mounted thermocouples. Additionally, as compared with other battery temperature estimation techniques that use polynomial regression based on an impedance measurement at a single frequency, embodiments described herein have lower computational cost, fewer model parameters, and the ability to reduce the effects of SOH and SOC variation on temperature estimation. Additionally, terminal voltage and/or cell capacity measurements may be added as inputs to the regression equation to further reduce the impact of SOH and SOC on the temperature estimate.

Monitoring of internal battery temperature is critical for improving battery performance. Monitoring enables maintenance of cell temperature within prescribed boundaries during fast charging, limitation of current to avoid overheating during rapid discharge, and ensuring a battery is not damaged due to abnormal usage to ensure safety.

As previously noted, and as generally illustrated in FIG. 1A, in accordance with features of embodiments described herein, multivariable polynomial regression is used to estimate the internal temperature of a rechargeable battery (such as a lithium ion battery) using terminal impedance measurements ($Z_{TERM} = V_{TERM}/I_{TERM}$) taken at multiple frequencies of an injected sinusoidal current $I_{TERM}$. In certain embodiments, the frequencies for use are identified based on a type of battery. For a given battery type, different frequencies have different temperature-, SOC-, and SOH-dependencies; therefore, multiple frequencies having different such dependencies are ideally selected. As a result, the internal battery temperature estimation system described herein is less sensitive to the exact frequencies selected for use as compared to single-frequency regression techniques previously employed for internal battery temperature estimation.

Figure 1B:
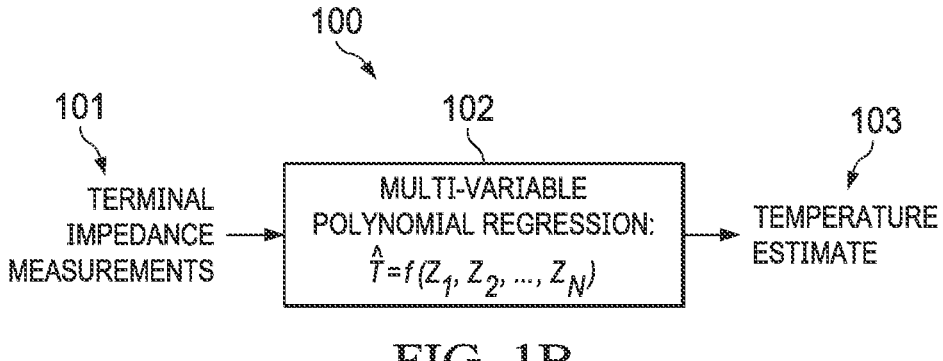

FIG. 1B illustrates a simplified block diagram of a system 100 for using multivariable polynomial regression to estimate the internal temperature of a battery from impedance measurements at multiple frequencies in accordance with one embodiment. As shown in FIG. 1B, terminal impedance measurements taken at a variety of selected frequencies (designated in FIG. 1B by a reference numeral 101) are input to a multivariable polynomial regression module 102, the output of which is an internal battery temperature estimate. In accordance with features of embodiments described herein, the module 102 implements a multi-variable polynomial regression equation that combines the received terminal impedance measurements 101 in a manner that cancels out SOC and SOH dependencies to produce an internal temperature estimate 103. No optimization during estimation is required. As described in greater detail below, in some embodiments, the regression equation implemented by the module 102 may be calibrated (e.g., factory-calibrated) to a particular battery instance using a small set of measurements from the battery instance.

Figure 2:
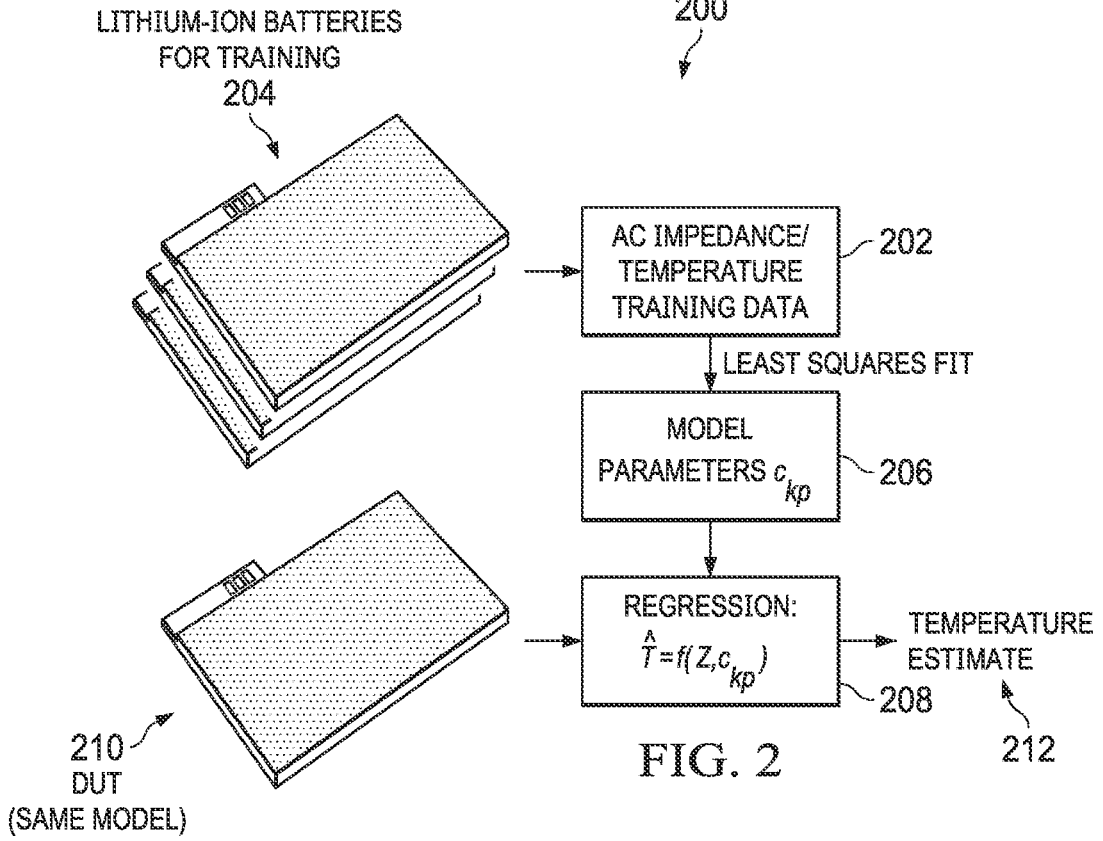
FIG. 2 is a flow diagram illustrating operation of a system in which multivariable polynomial regression is used for estimating the internal temperature of a battery using terminal impedance measurements taken at multiple frequencies of an injected sinusoidal current in accordance with features of embodiments described herein.

FIG. 2 is a flowchart 200 illustrating operation of the system 100 in accordance with an example embodiment. In step 202, a number of batteries 204 are used to generate training data comprising AC impedance and temperature data. During training, the batteries 204 are cycled many times at a constant current, with temperature varying between cycles and AC impedance (Z) being measured during discharge. In step 206, model parameters ($c_0$, $c_{kp}$) are empirically fit using, for example, linear least squares applied to the training data accumulated in step 202. The model parameters generated in step 206 are used in a regression equation in step 208, which regression equation is applied to terminal impedance measurements of a device under test (DUT) 210 (comprising a battery the model of which is the same as that of batteries 204) at multiple frequencies f to estimate an internal temperature 212 of the DUT.

In one embodiment, the multivariable polynomial regression equation applied in step 208 may be expressed as follows:

$$\hat{T} = c_0 + \sum_{k=0}^{K}\sum_{p=1}^{P} c_{kp}(\phi[k])^p$$

The temperature T is estimated using a multivariable polynomial regression on Z phase measurements $\phi[k]$ where k is the frequency index. In certain embodiments, the multivariable polynomial regression is a third order polynomial regression using multiple frequencies k (e.g., 20 Hz, 60 Hz, and 200 Hz) selected to cancel out SOC- and SOH-dependencies, and ten learned parameters.

In accordance with features of embodiments described herein, other inputs or monomial terms may be added to the polynomial regression equation as follows:

$$\hat{T} = c_0 + \sum_{k,p} c_{kp}(\phi[k])^p + \sum_n c_n V_{term}^n$$

$$\hat{T} = c_0 + \sum_{k,p} c_{kp}(\phi[k])^p + \sum_{\theta=(k_1,k_2,p_1,p_2)} c_\theta(\phi[k_1])^{p_1}(\phi[k_2])^{p_2}$$

Figure 3:
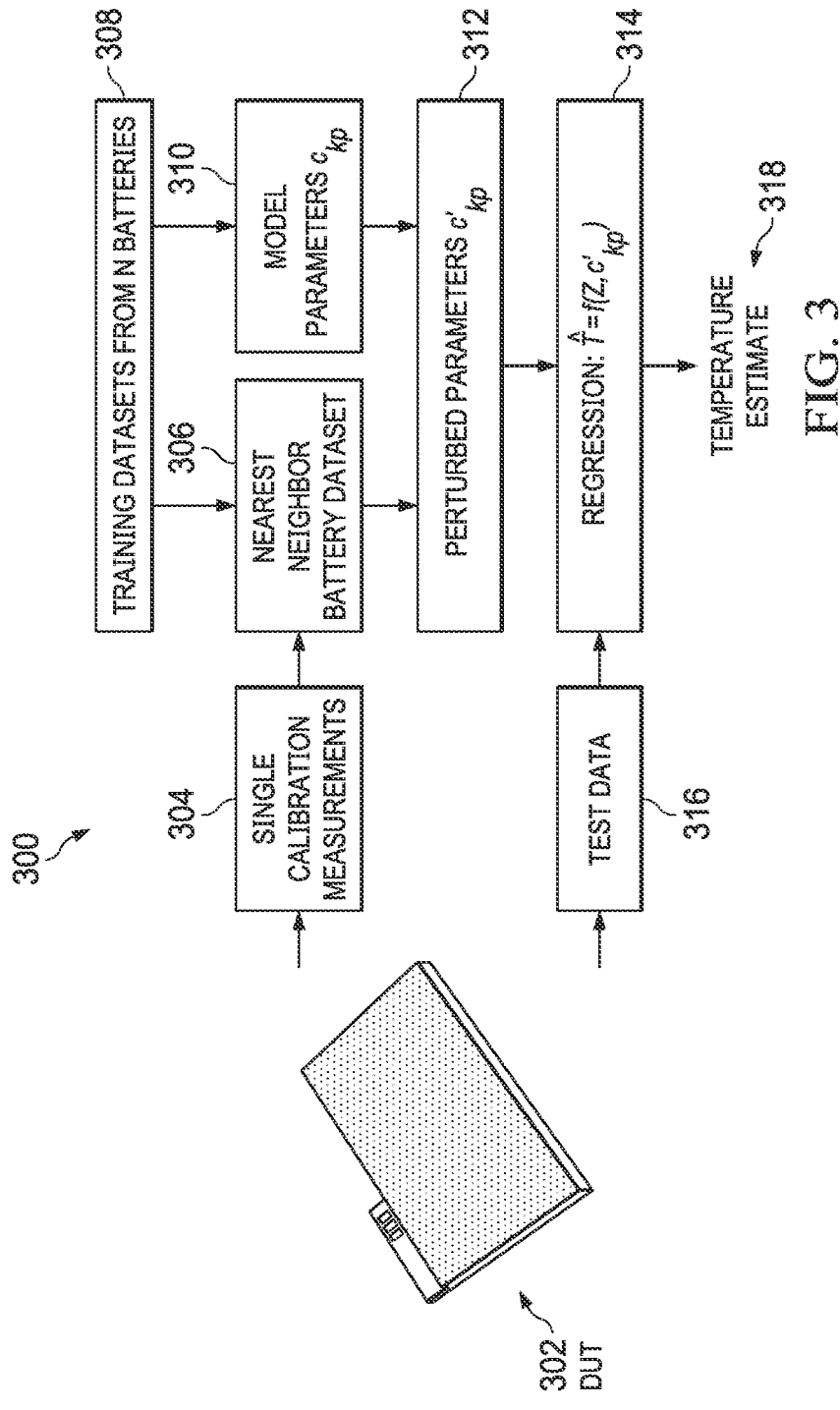
FIG. 3 is a flow diagram illustrating an example of single-measurement factory calibration of a battery model in accordance with features of embodiments described herein.

FIG. 3 illustrates a flow diagram 300 showing an example of single-measurement factory calibration of a DUT comprising a battery 302. It will be recognized that, although single-measurement calibration is shown and described, multiple measurement calibration may be implemented depending on the implementation. As shown in FIG. 3, a single calibration measurement comprising one set of impedance measurements taken at the beginning of the life of the DUT 302 under known conditions (e.g., 25 degrees C., 100% SOC) is taken in step 304. In step 306, a nearest neighbor dataset in a dataset library 308, which includes training datasets from N batteries of the same model as the DUT 302, is identified, e.g., using the Euclidian squared distance between the initial impedance measurements taken at the known conditions.

In step 310, model parameters $c_{kp}$ are also obtained from the dataset library 308. In step 312, the model parameters obtained in step 310 are perturbed to fit the nearest neighbor dataset 306 as follows:

1. $T_{res} = f(Z, c_{kp}) - T_{true}$
2. Fit ($T_{res}$, Z) dataset using the same polynomial model, with L2 regularization:

$$T_{res} = d_0 + \sum_{k,p} d_{kp}(\phi[k])^p$$

3. $c'_{kp} = c_{kp} - d_{kp}$

The perturbed parameters $c_{kp}'$ are used in the regression model 314 applied to test data 316 (i.e., impedance measurements) obtained from the DUT 302 to generate a temperature estimate 318.

In accordance with features of embodiments described herein, other inputs, such as terminal voltage ($V_{term}$) may be added to the regression equation. For example, $V_{term}$ (or other real-valued measurements) may simply be appended to the list of phase measurements $\phi[k]$, which is equivalent to:

$$\hat{T} = c_0 + \sum_{k,p} c_{kp}(\phi[k])^p + \sum_n c_n V_{term}^n$$

$V_{term}$ may compensate for SOC dependence; charge capacity $Q_{tot}$ may also be added in a similar manner to compensate for SOH dependence.

Additionally, higher-order cross terms may be added into the regression equation, for example (as previously noted):

$$\hat{T} = c_0 + \sum_{k,p} c_{kp}(\phi[k])^p + \sum_{\theta=(k_1,k_2,p_1,p_2)} c_\theta(\phi[k_1])^{p_1}(\phi[k_2])^{p_2}$$

Cross-terms may be limited to $p_1 = p_2 = 1$. Additionally, cross-terms may be used with $V_{term}$ or other real-valued measurements as described above.

In accordance with features of embodiments described herein, other inputs, such as battery state-of-charge (SOC) may be added to the regression equation. These inputs do not have to be measured directly, like other real-valued measurements (such as, battery terminal voltage) from the battery or other parts of the system that include the battery. For example, battery state-of-charge SOC may simply be appended to the list of phase measurements $\phi[k]$, which is equivalent to:

$$\hat{T} = c_0 + \sum_{k,p} c_{kp}(\phi[k])^p + \sum_q c_q SOC^q.$$

In accordance with features of embodiments described herein, other inputs, such as functions of other real-valued battery measurements, may be added to the regression equation. For example, let function $f(\bullet)$ describe the map from terminal voltage to an estimate of SOC, that is $SOC = f(V_{term})$. Then input $f(V_{term})$ may simply be appended to the list of phase measurements $\phi[k]$, which is equivalent to:

$$\hat{T} = c_0 + \sum_{k,p} c_{kp}(\phi[k])^p + \sum_r c_r f(V_{term})^r.$$

Additionally, memory terms can be added to the regression equation. For example, past temperature estimates, past input variables, or cross-terms with these memory terms can be added. For example, when history of phase measurements $\phi[k]$, $\phi[k-1]$, ..., $\phi[k-M]$ are used, the regression equation may have the following memory terms:

$$\hat{T} = c_0 + \sum_{m=0}^{M}\sum_{k,p} c_{kpm}(\phi[k-m])^p +$$

-continued $$\sum_{\theta=(k_1,k_2,p_1,p_2,m_1,m_2)} c_\theta(\phi[k_1-m_1])^{p_1}(\phi[k_2-m_2])^{p_2}$$

In certain embodiments, only immediate past measurements of impedance phase are used which corresponds to the memory depth parameter M=1.

As described herein, using multivariable polynomial regression to estimate temperature directly from terminal impedance measurements (and optionally other measurements such as terminal voltage and cell capacity) provides improved accuracy over a single measurement taken at a single frequency and operates to cancel the influence of SOH and SOC due to the fact that the influence of SOH and SOC varies with frequency. Additionally, terminal voltage may be used in order to improve estimates at low SOC. Still further, embodiments described herein are less sensitive to exactly what frequencies are used; therefore, there is no need to identify an "optimal" frequency with minimal SOH and SOC dependence.

Moreover, embodiments described herein do not require whole frequency sweep, thereby enabling reduced measurement time; remain linear-in-coefficients to allow for a linear least squares solution; and require a low number of parameters, thereby reducing the amount of data needed to fit.

In the calibration method shown in and described with reference to FIG. 3, the distance metric $d_i$ between the library dataset i and the calibration data is defined as the squared Euclidian distance between initial impedance measurements taken at known conditions:

$$d_i=|z_{cal}-z_{lib,i}|^2$$

where $z_{cal}$ is the impedance from the single calibration measurement, and $z_{lib,i}$ is the impedance from the ith dataset in the dataset library. Both $z_{cal}$ and $z_{lib,i}$ are measured at the same operating conditions (e.g., same temperature, same SOC, and similar SOH).

Alternatively, to determine the nearest neighbor dataset in a dataset library, instead of defining the distance metric $d_i$ as the squared Euclidian distance between impedance measurements, $d_i$ may be defined as the mean square error (MSE) that a perturbed model i achieves on the calibration dataset:

$$d_i = \sum_j (f(z_{cal,j}, c'_{kp,i}) - T_{cal,j})^2$$

where $z_{cal,j}$ and $T_{cal,j}$ represent the impedance and temperature of datapoint j in the calibration dataset. The calibration dataset could contain just one datapoint, or multiple datapoints, depending on what is available in the use case. $c_{kp,i}'$ represents the model coefficients that are perturbed to better fit dataset i in the dataset library, as described above. $f(z_{cal,j}, c'_{kp,i})$ represents the perturbed model with coefficients $c'_{kp,i}$ applied to input data $z_{cal,j}$ to yield a temperature estimate. Note that $f(z_{cal,j}, c'_{kp,i})$ is not limited to having the input data be only impedance; the input data can include other measurements or estimates (e.g. voltage, SOC, capacity) and the regression equation can include other terms (e.g. voltage, SOC, capacity, cross terms) as previously described. In general, other distance metrics $d_i$ may be used to determine the nearest neighbor dataset based on the calibration data.

Figure 4A:
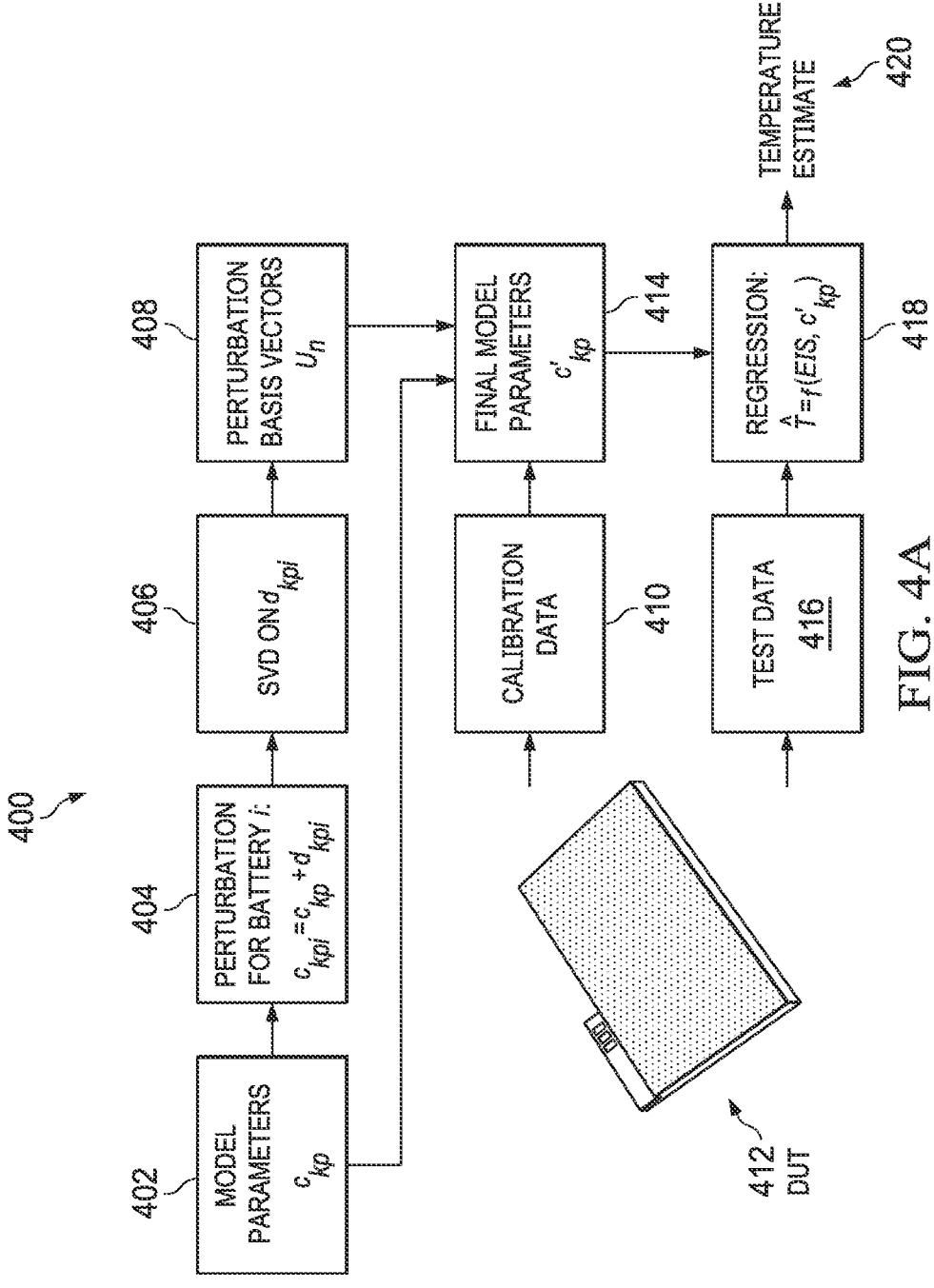
FIG. 4A is a flow diagram illustrating an alternative embodiment in which singular value decomposition (SVD)-based calibration may be used in connection with techniques for estimating an internal temperature of a battery using impedance measurements in accordance with features of embodiments described herein.

Referring to FIG. 4A, in an alternative embodiment, model calibration may be performed using singular value decomposition (SVD)-based calibration technique, as illustrated in a flow diagram 400. Using the existing training dataset, model parameters are obtained (step 402) and perturbations are determined for each battery that improve the fit (step 404). SVD is applied to the model perturbations (step 406) to determine perturbation basis vectors $U_n$ (step 408) that can be used to better fit a calibration dataset 410 for a DUT 412 to develop final model parameters (step 414) to be applied to the regression model.

In step 418, the regression model is applied to test data 416 for the DUT 412 to develop a temperature estimate 420.

Figure 4B:
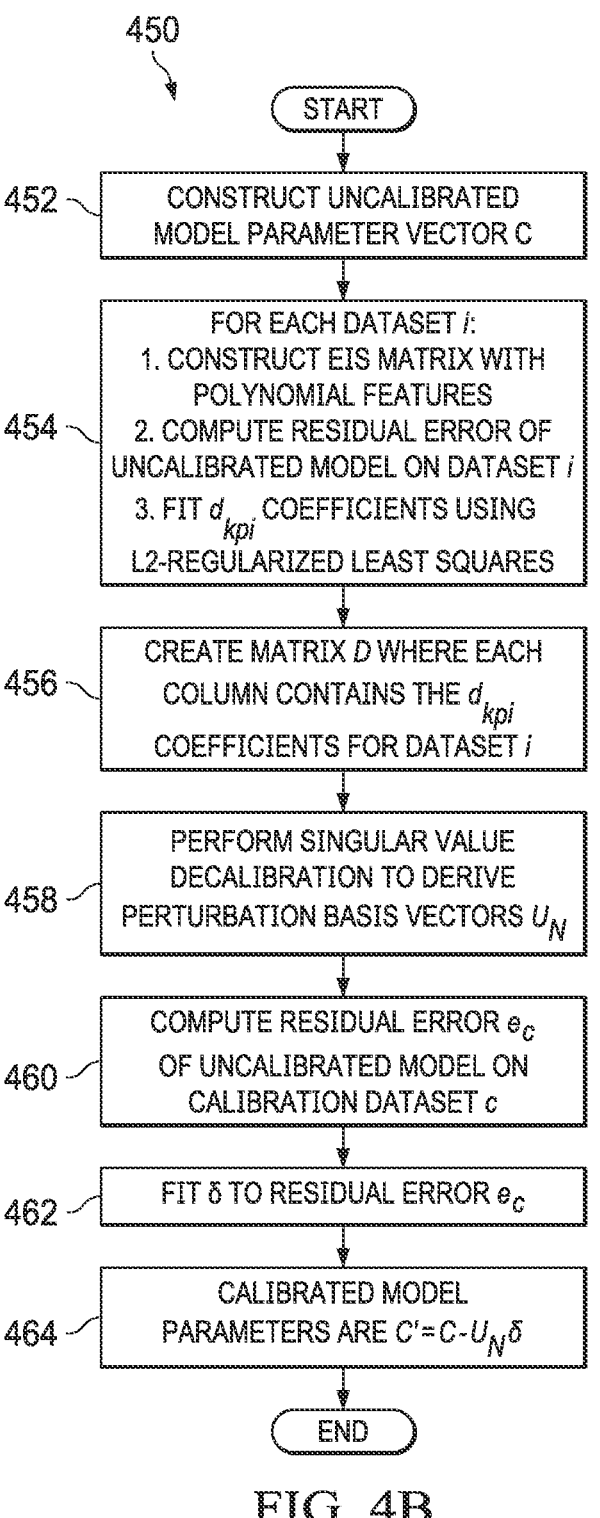
FIG. 4B is a flow diagram illustrating details of SVD calibration for use in connection with techniques for estimating an internal temperature of a battery using impedance measurements in accordance with features of embodiments described herein.

Referring now to FIG. 4B, in one embodiment, SVD calibration may be performed as illustrated in a flow diagram 450. First, in step 452, an uncalibrated model parameter vector C containing the model parameters $c_{kp}$ is constructed. In step 454, for each dataset is (1) the EIS matrix $Z_i$ is constructed with polynomial features (rows are datapoints, columns are features); (2) the residual error $e_i$ of the uncalibrated model on dataset i is computed using the equation $e_i=Z_iC-T_{true,i}$; and (3) $d_{kpi}$ is fit using L2-regularized least squares ($e_i \approx Z_i d_{kpi}$).

In step 456, a matrix D is created in which each column contains the $d_{kp}$ coefficients for dataset i. In step 458, SVD is then performed on $d_{kpi}$ as follows: (1) define D as $D=U\Sigma V^T$; (2) take the N most significant singular vectors from U and define them as perturbation basis vectors $U_N$. In step 460, the residual error of the uncalibrated model on the calibration dataset c is computed using the equation $e_c=Z_cC-T_{true,c}$. In step 462, $\delta$ is fit to $e_c$ using the equation $e_c \approx Z_c U_N \delta$. In step 464, the resulting calibrated model parameters C' are equal to $C-U_{N\delta}$.

In some embodiments described herein, $\delta$ represents the weights or coefficients applied to the basis vectors $U_N$ to create the perturbation vector to be applied to the model parameters or coefficients C. The basis vectors $U_N$ represent the typical ways that the model coefficients vary from battery to battery. $\delta$ is found using calibration data in order to determine how much of each basis vector should be used the perturb the model to better fit the calibration dataset.

When a battery is in steady-state (i.e., internal temperature similar to external temperature), a calibration measurement (Z, T) can be taken. Such calibration measurements may be accumulated over the lifetime of a battery to form the overall calibration dataset. Alternatively a specific time window from the historical data may be used. Temperature estimation parameters can be recalibrated from this dataset using SVD calibration, as described above.

Figure 5:
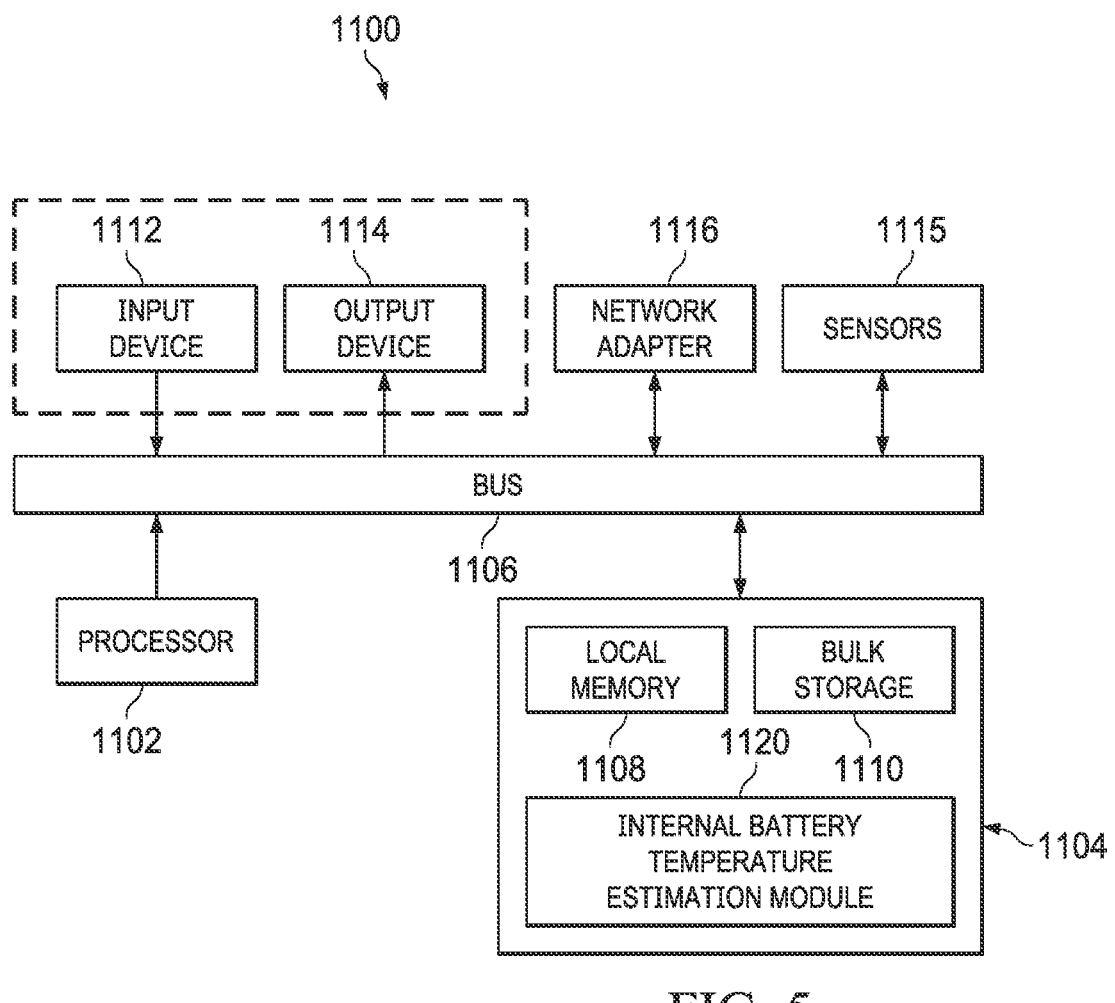
FIG. 5 is a block diagram of a computer system that may be used to implement all or some portion of the system for estimating an internal temperature of a battery using impedance measurements in accordance with features of embodiments described herein.

FIG. 5 is a block diagram illustrating an example system 1100 that may be configured to implement at least portions of techniques for internal battery temperature estimation using impedance measurements in accordance with embodiments described herein, and more particularly as shown in the FIGURES described hereinabove. As shown in FIG. 5, the system 1100 may include at least one processor 1102, e.g. a hardware processor 1102, coupled to memory elements 1104 through a system bus 1106. As such, the system may store program code and/or data within memory elements 1104. Further, the processor 1102 may execute the program code accessed from the memory elements 1104 via a system bus 1106. In one aspect, the system may be implemented as a computer that is suitable for storing and/or executing program code. It should be appreciated, however, that the system 1100 may be implemented in the form of any system including a processor and a memory that is capable of performing the functions described in this disclosure.

In some embodiments, the processor 1102 can execute software or an algorithm to perform the activities as discussed in this specification; in particular, activities related to internal battery temperature estimation using impedance measurements in accordance with embodiments described herein. The processor 1102 may include any combination of hardware, software, or firmware providing programmable logic, including by way of non-limiting example a microprocessor, a DSP, a field-programmable gate array (FPGA), a programmable logic array (PLA), an integrated circuit (IC), an application specific IC (ASIC), or a virtual machine processor. The processor 1102 may be communicatively coupled to the memory element 1104, for example in a direct-memory access (DMA) configuration, so that the processor 1102 may read from or write to the memory elements 1104.

In general, the memory elements 1104 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked, or sent to or from any of the components of the system 1100 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures may also include suitable interfaces for receiving, transmitting, and/or otherwise communicating data or information in a network environment so that they can communicate with, for example, a system having hardware similar or identical to another one of these elements.

In certain example implementations, mechanisms for implementing internal battery temperature estimation using impedance measurements as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as e.g. the memory elements 1104 shown in FIG. 5 can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as e.g. the processor 1102 shown in FIG. 5, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 1104 may include one or more physical memory devices such as, for example, local memory 1108 and one or more bulk storage devices 1110. The local memory may refer to RAM or other non-persistent memory device(s) generally used during actual execution of the program code. A bulk storage device may be implemented as a hard drive or other persistent data storage device. The processing system 1100 may also include one or more cache memories (not shown) that provide temporary storage of at least some program code in order to reduce the number of times program code must be retrieved from the bulk storage device 1110 during execution.

As shown in FIG. 5, the memory elements 1104 may store an internal battery temperature estimation module 1120. In various embodiments, the module 1120 may be stored in the local memory 1108, the one or more bulk storage devices 1110, or apart from the local memory and the bulk storage devices. It should be appreciated that the system 1100 may further execute an operating system (not shown in FIG. 5) that can facilitate execution of the module 1120. The module 1120, being implemented in the form of executable program code and/or data, can be read from, written to, and/or executed by the system 1100, e.g., by the processor 1102. Responsive to reading from, writing to, and/or executing the module 1120, the system 1100 may be configured to perform one or more operations or method steps described herein.

Input/output (I/O) devices depicted as an input device 1112 and an output device 1114, optionally, may be coupled to the system. Examples of input devices may include, but are not limited to, a keyboard, a pointing device such as a mouse, or the like. Examples of output devices may include, but are not limited to, a monitor or a display, speakers, or the like. In some implementations, the system may include a device driver (not shown) for the output device 1114. Input and/or output devices 1112, 1114 may be coupled to the system 1100 either directly or through intervening I/O controllers. Additionally, sensors 1115, may be coupled to the system 1100 either directly or through intervening controllers and/or drivers.

In an embodiment, the input and the output devices may be implemented as a combined input/output device (illustrated in FIG. 5 with a dashed line surrounding the input device 1112 and the output device 1114). An example of such a combined device is a touch sensitive display, also sometimes referred to as a "touch screen display" or simply "touch screen." In such an embodiment, input to the device may be provided by a movement of a physical object, such as e.g. a stylus or a finger of a user, on or near the touch screen display.

A network adapter 1116 may also, optionally, be coupled to the system 1100 to enable it to become coupled to other systems, computer systems, remote network devices, and/or remote storage devices through intervening private or public networks. The network adapter may comprise a data receiver for receiving data that is transmitted by said systems, devices and/or networks to the system 1100, and a data transmitter for transmitting data from the system 1100 to said systems, devices and/or networks. Modems, cable modems, and Ethernet cards are examples of different types of network adapter that may be used with the system 1100.

Example 1 is a method for estimating an internal temperature of a battery, the method comprising obtaining multiple terminal impedance measurements for the battery, wherein each of the terminal impedance measurements is obtained at a different one of a plurality of frequencies; determining model parameters for a multivariable polynomial regression model; and applying the multivariable polynomial regression model to the multiple terminal impedance measurements to estimate the internal temperature of the battery.

In Example 2, the method of Example 1 may further include the battery comprising a rechargeable battery.

In Example 3, the method of any of Examples 1-2 may further include the plurality of frequencies being selected to compensate for effects of at least one of battery state of charge (SOC) and battery state of health (SOH) dependencies of the model.

In Example 4, the method of any of Examples 1-3 may further include the determining the model parameters comprising obtaining training data from a set of training batteries and applying a linear least squares fit to the training data.

In Example 5, the method of any of Examples 1-4 may further include the training data comprising alternating current (AC) data and temperature data for the set of training batteries.

In Example 6, the method of any of Examples 1-5 may further include augmenting an equation comprising the multipolynomial regression model using at least one of an additional input and a monomial term.

In Example 7, the method of any of Examples 1-6 may further include the at least one of an additional input and a monomial term including a battery terminal voltage.

In Example 8, the method of any of Examples 1-7 may further include the at least one of an additional input and a monomial term including a charge capacity of the battery.

In Example 9, the method of any of Examples 1-8 may further include augmenting an equation comprising the multipolynomial regression model by adding a higher-order cross-term to the equation.

In Example 10, the method of any of Examples 1-9 may further include augmenting an equation comprising the multipolynomial regression model to include an input to compensate for battery state of charge (SOC).

In Example 11, the method of any of Examples 1-10 may further include augmenting an equation comprising the multipolynomial regression model by adding a function of another measurement of the battery to the equation.

In Example 12, the method of any of Examples 1-11 may further include augmenting an equation comprising the multipolynomial regression module to include a memory term.

In Example 13, the method of any of Examples 1-2 may further include calibrating the model parameters using at least one initial set of impedance measurements for the battery.

In Example 14, the method of any of Examples 1-13 may further include the calibrating the model parameters further including identifying a nearest neighbor dataset in a library of training datasets using the at least one initial set of impedance measurements and perturbing the model parameters to fit model parameters of the identified nearest neighbor dataset.

In Example 15, the method of any of Examples 1-14 may further include the at least one set of initial impedance measurements being taken at a beginning of a life of the battery.

In Example 16, the method of any of Examples 1-15 may further include the at least one set of initial impedance measurements comprising a plurality of sets of initial impedance measurements.

In Example 17, the method of any of Examples 1-16 may further include calibrating the model parameters using a singular value decomposition (SVD) method.

Example 18 is a method for estimating an internal temperature of a battery from terminal impedance measurements of the battery, the method comprising obtaining multiple terminal impedance measurements for the battery at a plurality of frequencies; deriving model parameters for a multivariable polynomial regression model, the deriving comprising obtaining training data from a set of training batteries similar to the battery and applying a linear least squares fit to the training data; and combining the multiple terminal impedance measurements using the multivariable polynomial regression model to produce an estimate of the internal temperature of the battery, wherein the plurality of frequencies span a range of frequencies selected to reduce dependence of the estimate of the internal temperature of the battery on a state of health (SOH) of the battery and a state of charge (SOC) of the battery.

In Example 19, the method of Example 18 may further include augmenting an equation comprising the multipolynomial regression model using at least one of an additional input and a monomial term.

In Example 20, the method of any of Examples 18-19 may further include augmenting an equation comprising the multipolynomial regression model by adding a higher-order cross-term to the equation.

In Example 21, the method of any of Examples 18-20 may further include augmenting an equation comprising the multipolynomial regression model to include an input to compensate for battery state of charge (SOC).

In Example 22, the method of any of Examples 18-21 may further include augmenting an equation comprising the multipolynomial regression model by adding a function of another measurement of the battery to the equation.

In Example 23, the method of any of Examples 18-22 may further include augmenting an equation comprising the multipolynomial regression module to include a memory term.

In Example 24, the method of any of Examples 18-23 may further include calibrating the model parameters using at least one initial set of impedance measurements for the battery.

In Example 25, the method of any of Examples 18-24 may further include the calibrating the model parameters including identifying a nearest neighbor dataset in a library of training datasets comprising the training data using the at least one initial set of impedance measurements; and perturbing the model parameters to fit model parameters of the identified nearest neighbor dataset.

In Example 26, the method of any of Examples 18-25 may further include the at least one set of initial impedance measurements being taken at a beginning of a life of the battery.

In Example 27, the method of any of Examples 18-26 may further include the at least one set of initial impedance measurements comprising a plurality of sets of initial impedance measurements.

In Example 28, the method of any of Examples 18-27 may further include calibrating the model parameters using a singular value decomposition (SVD) method.

Example 29 is a system for estimating an internal temperature of a battery from a plurality of terminal impedance measurements obtained for the battery, wherein the plurality of terminal impedance measurements are taken at a plurality of frequencies, the system comprising a multivariable polynomial regression model comprising a number of model parameters, the multivariable polynomial regression model combining the multiple terminal impedance measurements to generate an estimate the internal temperature of the battery; wherein the plurality of frequencies span a range of frequencies selected to reduce dependence of the estimate of the internal temperature of the battery on a state of health (SOH) of the battery and a state of charge (SOC) of the battery.

In Example 30, the system of Example 29 may further include the battery comprising a rechargeable battery.

In Example 31, the system of any of Examples 29-30 may further include model parameters of the multivariable polynomial regression model being determined by obtaining training data from a set of training batteries and applying a linear least squares fit to the training data.

In Example 32, the system of any of Examples 29-31 may further include an equation comprising the multipolynomial regression model includes at least one of an additional input and a monomial term.

In Example 33, the system of any of Examples 29-32 may further include the at least one of an additional input and a monomial term including a battery terminal voltage.

In Example 34, the system of any of Examples 29-33 may further include the at least one of an additional input and a monomial term including a charge capacity of the battery.

In Example 35, the system of any of Examples 29-34 may further include the equation comprising the multipolynomial regression model including an input to compensate for battery state of charge (SOC).

In Example 36, the system of any of Examples 29-35 may further include an equation comprising the multipolynomial regression model comprising a function of another measurement of the battery to the equation.

In Example 37, the system of any of Examples 29-36 may further include an equation comprising the multipolynomial regression module including a memory term.

In Example 38, the system of any of Examples 29-37 may further include the model parameters being calibrated using at least one initial set of impedance measurements for the battery.

In Example 39, the system of any of Examples 29-38 may further include the calibrating the model parameters including identifying a nearest neighbor dataset in a library of training datasets using the at least one initial set of impedance measurements; and perturbing the model parameters to fit model parameters of the identified nearest neighbor dataset.

In Example 40, the system of any of Examples 29-39 may further include the at least one set of initial impedance measurements being taken at a beginning of a life of the battery.

In Example 41, the system of any of Examples 29-39 may further include the at least one set of initial impedance measurements comprising a plurality of sets of initial impedance measurements.

In Example 42, the system of any of Examples 29-41 may further include the model parameters being calibrated using a singular value decomposition (SVD) method.

It should be noted that all of the specifications, dimensions, and relationships outlined herein (e.g., the number of elements, operations, steps, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, exemplary embodiments have been described with reference to particular component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system may be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and may accommodate a large number of components, as well as more complicated/sophisticated arrangements and configurations. Accordingly, the examples provided should not limit the scope or inhibit the broad teachings of the electrical circuits as potentially applied to myriad other architectures.

It should also be noted that in this Specification, references to various features (e.g., elements, structures, modules, components, steps, operations, characteristics, etc.) included in "one embodiment", "exemplary embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It should also be noted that the functions related to circuit architectures illustrate only some of the possible circuit architecture functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Note that all optional features of the device and system described above may also be implemented with respect to the method or process described herein and specifics in the examples may be used anywhere in one or more embodiments.

The 'means for' in these instances (above) may include (but is not limited to) using any suitable component discussed herein, along with any suitable software, circuitry, hub, computer code, logic, algorithms, hardware, controller, interface, link, bus, communication pathway, etc.

Note that with the example provided above, as well as numerous other examples provided herein, interaction may be described in terms of two, three, or four network elements. However, this has been done for purposes of clarity and example only. In certain cases, it may be easier to describe one or more of the functionalities of a given set of flows by only referencing a limited number of network elements. It should be appreciated that topologies illustrated in and described with reference to the accompanying FIGURES (and their teachings) are readily scalable and may accommodate a large number of components, as well as more complicated/sophisticated arrangements and configurations. Accordingly, the examples provided should not limit the scope or inhibit the broad teachings of the illustrated topologies as potentially applied to myriad other architectures.

It is also important to note that the steps in the preceding flow diagrams illustrate only some of the possible signaling scenarios and patterns that may be executed by, or within, communication systems shown in the FIGURES. Some of these steps may be deleted or removed where appropriate, or these steps may be modified or changed considerably without departing from the scope of the present disclosure. In addition, a number of these operations have been described as being executed concurrently with, or in parallel to, one or more additional operations. However, the timing of these operations may be altered considerably. The preceding operational flows have been offered for purposes of example and discussion. Substantial flexibility is provided by communication systems shown in the FIGURES in that any suitable arrangements, chronologies, configurations, and timing mechanisms may be provided without departing from the teachings of the present disclosure.

Although the present disclosure has been described in detail with reference to particular arrangements and configurations, these example configurations and arrangements may be changed significantly without departing from the scope of the present disclosure. For example, although the present disclosure has been described with reference to particular communication exchanges, embodiments described herein may be applicable to other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 142 as it exists on the date of the filing hereof unless the words "means for" or "step for" are specifically used in the particular claims; and (b) does not intend, by any statement in the specification, to limit this disclosure in any way that is not otherwise reflected in the appended claims.

What is claimed is:

1. A method for estimating an internal temperature of a battery, the method comprising:
   injecting a plurality of periodic signals into the battery, wherein each of the periodic signals have a different frequency of a plurality of frequencies;
   obtaining multiple terminal impedance measurements for the battery in response to the plurality of periodic signals, wherein each of the terminal impedance measurements is obtained at a respective different one of the plurality of frequencies;
   determining model parameters for a multivariable polynomial regression model for estimating the internal temperature of the battery;

inputting the multiple terminal impedance measurement into the multivariable polynomial regression model as a plurality of inputs; and
applying the multivariable polynomial regression model to the multiple terminal impedance measurements to estimate the internal temperature of the battery as an output of the multivariable polynomial regression model.

2. The method of claim 1, wherein the plurality of frequencies are selected to compensate for effects of at least one of battery state of charge (SOC) or battery state of health (SOH) dependencies of the model.

3. The method of claim 1, wherein the determining the model parameters comprises:
   obtaining training data from a set of training batteries; and
   applying a linear least squares fit to the training data.

4. The method of claim 3, wherein the training data comprises alternating current (AC) data and temperature data for the set of training batteries.

5. The method of claim 1 further comprising calibrating the model parameters using at least one initial set of impedance measurements for the battery.

6. The method of claim 5, wherein the calibrating the model parameters further includes:
   identifying a nearest neighbor dataset in a library of training datasets using the at least one initial set of impedance measurements; and
   perturbing the model parameters to fit model parameters of the identified nearest neighbor dataset;
   wherein the at least one set of initial impedance measurements is taken at a beginning of a life of the battery.

7. The method of claim 1 further comprising augmenting an equation comprising the multivariable polynomial regression model using at least one of an additional input and a monomial term.

8. The method of claim 7, wherein the additional input includes at least one of a battery terminal voltage or a charge capacity of the battery.

9. The method of claim 7 wherein the additional term includes at least one of an input to compensate for battery state of charge (SOC), a function of another measurement of the battery, or a memory term.

10. A method for estimating an internal temperature of a battery from terminal impedance measurements of the battery, the method comprising:
   obtaining multiple terminal impedance measurements for the battery at a plurality of frequencies based on a plurality of periodic signals injected into the battery, wherein each of the periodic signals have a different frequency of the plurality of frequencies;
   deriving model parameters for a multivariable polynomial regression model, the deriving comprising:
      obtaining training data from a set of training batteries similar to the battery; and
      applying a linear least squares fit to the training data; and
   combining the multiple terminal impedance measurements using the multivariable polynomial regression model to produce an estimate of the internal temperature of the battery as an output of the multivariable polynomial regression model;
   wherein the plurality of frequencies span a range of frequencies selected to reduce dependence of the estimate of the internal temperature of the battery on a state of health (SOH) of the battery and a state of charge (SOC) of the battery.

11. The method of claim 10 further comprising augmenting an equation comprising the multivariable polynomial regression model to include an input to compensate for battery state of charge (SOC).

12. The method of claim 10 further comprising augmenting an equation comprising the multivariable polynomial regression model by adding a function of another measurement of the battery to the equation.

13. The method of claim 10 further comprising augmenting an equation comprising the multivariable polynomial regression model to include a memory term.

14. The method of claim 10 further comprising calibrating the model parameters using at least one initial set of impedance measurements for the battery, wherein the calibrating the model parameters further includes:

identifying a nearest neighbor dataset in a library of training datasets comprising the training data using the at least one initial set of impedance measurements; and perturbing the model parameters to fit model parameters of the identified nearest neighbor dataset.

15. The method of claim 10 further comprising augmenting an equation comprising the multivariable polynomial regression model using at least one of an additional input and a monomial term.

16. The method of claim 10 further comprising augmenting an equation comprising the multivariable polynomial regression model by adding a higher-order cross-term to the equation.

17. A system for estimating an internal temperature of a battery from a plurality of terminal impedance measurements obtained for the battery, wherein the plurality of terminal impedance measurements are taken at a plurality of frequencies, the system comprising:

at least one hardware processor; and at least one memory storing instructions that cause the at least one hardware processor to perform operations comprising:

providing a multivariable polynomial regression model comprising a number of model parameters, the multivariable polynomial regression model configured to combine the plurality of terminal impedance measurements to generate an estimate the internal temperature of the battery;

wherein the plurality of frequencies span a range of frequencies selected to reduce dependence of the estimate of the internal temperature of the battery on a state of health (SOH) of the battery and a state of charge (SOC) of the battery;

obtaining the plurality of terminal impedance measurements for the battery based on a plurality of periodic signals injected into the battery, wherein each of the periodic signals have a different frequency of the plurality of frequencies;

inputting the plurality of terminal impedance measurement into the multivariable polynomial regression model as a plurality of inputs; and applying the multivariable polynomial regression model to the plurality of terminal impedance measurements to estimate the internal temperature of the battery as an output of the multivariable polynomial regression model.

18. The system of claim 17, wherein the battery comprises a rechargeable battery.

19. The system of claim 17, wherein model parameters of the multivariable polynomial regression model are determined by obtaining training data from a set of training batteries and applying a linear least squares fit to the training data.

20. The system of claim 17, wherein the model parameters are calibrated using at least one initial set of impedance measurements for the battery, wherein the calibrating the model parameters further includes:

identifying a nearest neighbor dataset in a library of training datasets using the at least one initial set of impedance measurements; and perturbing the model parameters to fit model parameters of the identified nearest neighbor dataset.

\* \* \* \* \*